United States Patent
Numasawa et al.

(10) Patent No.: US 7,530,359 B2
(45) Date of Patent: May 12, 2009

(54) PLASMA TREATMENT SYSTEM AND CLEANING METHOD OF THE SAME

(75) Inventors: Yoichiro Numasawa, Machida (JP); Yoshimi Watabe, Yokohama (JP)

(73) Assignees: Canon Anelva Corporation, Kawasaki-shi (JP); Sanyo Electric Co., Ltd., Osaka (JP); Renesas Technology Corporation, Tokyo (JP); Matsushita Electric Industrial Co., Ltd., Osaka (JP); Ulvac, Inc., Chigasaki-shi (JP); Hitachi Kokusai Electric Inc., Tokyo (JP); Tokyo Electron Limited, Tokyo (JP); Kanto Denka Kogyo Co., Ltd., Tokyo (JP)

( * ) Notice: Subject to any disclaimer, the term of this patent is extended or adjusted under 35 U.S.C. 154(b) by 608 days.

(21) Appl. No.: 10/477,457

(22) PCT Filed: May 16, 2002

(86) PCT No.: PCT/JP02/04740

§ 371 (c)(1),
(2), (4) Date: Nov. 12, 2003

(87) PCT Pub. No.: WO02/093632

PCT Pub. Date: Nov. 21, 2002

(65) Prior Publication Data

US 2004/0149386 A1 Aug. 5, 2004

(30) Foreign Application Priority Data

May 17, 2001 (JP) .............................. 2001-148327

(51) Int. Cl.
*B08B 7/04* (2006.01)
*B08B 7/00* (2006.01)

(52) U.S. Cl. .............................. 134/1.1; 134/26; 134/30; 134/22.1; 134/22.12; 438/905

(58) Field of Classification Search ................... 134/26, 134/30, 1, 1.1, 22.1, 22.12; 438/905
See application file for complete search history.

(56) References Cited

U.S. PATENT DOCUMENTS

| 4,960,488 | A | * | 10/1990 | Law et al. ................... 438/694 |
| 5,158,644 | A | * | 10/1992 | Cheung et al. .............. 438/694 |
| 6,060,397 | A | * | 5/2000 | Seamons et al. ............ 438/694 |

FOREIGN PATENT DOCUMENTS

| JP |   07335617 A | * 12/1995 |
| JP | A 07-335617 | 12/1995 |
| JP | A 08-339895 | 12/1996 |
| JP | A 10-092796 | 4/1998 |
| JP | A 10-237657 | 9/1998 |
| JP | A 11-031661 | 2/1999 |

* cited by examiner

*Primary Examiner*—Alexander Markoff
(74) *Attorney, Agent, or Firm*—Oliff & Berridge, PLC

(57) ABSTRACT

A plasma treatment apparatus has a reaction vessel (11) provided with a top electrode (13) and a bottom electrode (14), and the first electrode is supplied with a VHF band high frequency power from a VHF band high frequency power source (32), while the bottom electrode on which a substrate (12) is loaded and is moved by a vertical movement mechanism. The plasma treatment system has a controller (36) which, at the time of a cleaning process after forming a film on the substrate (12), controls a vertical movement mechanism to move the bottom electrode to narrow the gap between the top electrode and bottom electrode and form a narrow space and starts cleaning by a predetermined high density plasma in that narrow space. In the cleaning process, step cleaning is performed. Due to this, the efficiency of utilization of the cleaning gas is increased, the amount of exhaust gas is cut, and the cleaning speed is raised. Further, the amount of the process gas used is cut and the process cost is reduced.

5 Claims, 4 Drawing Sheets

PLASMA TREATMENT SYSTEM AND CLEANING METHOD OF THE SAME

TECHNICAL FIELD

The present invention relates to a plasma treatment system and a cleaning method of the same, more particularly, relates to a large-sized plasma treatment system and a method of cleaning the same which improves the efficiency of utilization of cleaning gas and reduces the amount of PFC (perfluorocarbon) exhaust gas.

BACKGROUND ART

Conventional plasma CVD systems, for example, are mainly designed to satisfy requirements in the deposition process. A cleaning process for cleaning the inside of the deposition chamber of the plasma CVD system is merely performed as an added step of regulating the deposition process. Further, the deposition chamber is provided with a parallel plate type electrode comprised of a top electrode and a bottom electrode. In the parallel plate type electrodes, high frequency power is fed to the top electrode to generate discharge plasma in the deposition chamber. As a frequency of the above high frequency power, a frequency of 13.56 MHz included in a HF band, which is designated in industrial band specifications, is used. The bottom electrode functions as a substrate holder. A substrate on which a film is deposited is carried on it. Usually, the bottom electrode is attached by a fixed structure. Further, the bottom electrode is usually made by an aluminum alloy or at least a part thereof is treated on it surface with alumite or aluminum oxide. On the other hand, most of the top electrodes are made by the same material as the bottom electrode. In some cases the top electrode is made by pure aluminum.

As a document disclosing the prior art, Japanese Patent Publication (A) No. 10-237657 may be mentioned. The plasma treatment system disclosed in this publication is comprised of a reaction vessel (10: reference numeral used in the publication, same below) provided with a shower head (21) to which the high frequency power is supplied, and a susceptor (2) loading a substrate (70) and raised and lowered by a substrate elevation mechanism (50). The reaction vessel shows the structure in which the shower head (21) is fixed on the chamber (31) through an insulator (41). The insulator (41) electrically insulates the shower head (21) and the chamber (31).

In the development of the recent large-sized plasma CVD systems, priority is being given to the system concept of "raising the efficiency of utilization of the PFC cleaning gas to cut the amount of exhaust". According to this system concept, the system is being designed to incorporate requirements from the deposition process. Therefore, it is not possible to position the cleaning process of the inside of the deposition chamber as an additional process for the deposition process in the deposition chamber.

In the above plasma CVD system, using the frequency of 13.56 MHz has the advantage of use of an industrial band, but production of high density plasma by a system having the parallel plate type electrode is difficult. This, in particular, has more important meaning in the cleaning process.

According to the conventional plasma CVD systems, the density of the plasma produced between the top electrode and the bottom electrode is low and bias voltage is not applied to the electrodes, so problems do not arise in the top electrode and bottom electrode produced by the above materials. However, if making the density of the plasma higher or applying a high bias voltage to the electrodes, several problems arise in the deposition process or cleaning process or in maintenance of the chamber.

When applying a high bias voltage for PFC plasma cleaning, for example, since the amount of fluorine radicals produced by dissociation of the PFC cleaning gas is large, the problem of corrosion occurs in the entire deposition chamber with the conventional materials or structures.

When producing plasma of high density and depositing a film on the substrate by plasma CVD, the plasma is produced in the narrow space between the top electrode and the bottom electrode. If the inner surface of the deposition chamber is exposed to the narrow space when using plasma for CVD, film will easily deposit on the exposed inner surface. As a result, the problem arises that cleaning will become troublesome and cleaning cannot be efficiently performed.

Further, in the conventional large-sized plasma CVD system, when producing plasma in a wide space for depositing film on the substrate by CVD, the film easily deposits on the entire inner surface of the deposition chamber.

An object of the present invention is to provide a plasma treatment system and a cleaning method of the same which eliminate the problem of corrosion and improve the efficiency of utilization of the cleaning gas so as to reduce the amount of exhaust gas and improve the cleaning efficiency.

Another object of the present invention is to provide a plasma treatment system and a cleaning method of the same which reduce the film deposition on the inner surface of the chamber and improve the cleaning efficiency so as to reduce the amount of process gas used, improve the productivity, and be of help in solving the problem of global warming.

DISCLOSURE OF THE INVENTION

The plasma treatment system and its cleaning method according to the present invention are configured as follows to achieve the above object.

The plasma treatment system according to the present invention is comprised of a chamber able to be reduced to a vacuum, in which an electrode structure including a first electrode and a second electrode are provided. The first electrode is supplied with a high frequency power from a VHF band high frequency power source. The second electrode has a substrate stage and is moved up and down by a vertical movement mechanism. In the deposition process, the movement mechanism is used to move the second electrode to narrow the gap between the first electrode and the second electrode and form a narrow space. Predetermined plasma of low density is generated in this narrow space. This plasma is utilized to deposit a film on a substrate. After the end of the film deposition or formation, the second electrode is made to move downward and a substrate unloading mechanism is used to unload the substrate, then a cleaning process is performed. In the cleaning process, the movement mechanism is used to again move the second electrode to narrow the gap between the first electrode and the second electrode and form a narrow space. Then, predetermined plasma of high density is used in this narrow space to start the cleaning process. A controller for executing a cleaning operation controls the above cleaning process. In the usual configuration, the first electrode is the top electrode and the second electrode is the bottom electrode. The bottom electrode is typically raised and lowered in a state of loading the substrate.

In the above plasma treatment system, it is possible to generate high power, high density plasma and start cleaning in a narrow space produced by the state of the first electrode and second electrode being made to approach each other.

In the above plasma treatment system, preferably, the high density of the plasma is, as an indicator of electron density, at least 1E11 cm$^{-3}$ ($10^{11}$ cm$^{-3}$), typically at least 5E11 cm$^{-3}$ ($5 \times 10^{11}$ cm$^{-3}$).

In the above plasma treatment system, preferably, the inner wall of the chamber is covered by an insulator ring down to at least 2 cm (or 3 cm) from the main surface of the first electrode and the gap between the insulator ring and sides of the second electrode is formed with a constricted region having a gap of not more than 5 mm.

In the above plasma treatment system, preferably, the insulator ring is made from alumite or aluminum oxide.

In the above plasma treatment system, preferably, an LF band low frequency from an LF band low frequency power source is superposed on the high frequency power from the VHF band high frequency power source.

In the above plasma treatment system, preferably, the first electrode and second electrode are both made from pure aluminum having an impurity concentration of 1E-3 ($10^{-3}$) or less.

The cleaning method of a plasma treatment system according to the present invention is a cleaning method for removing the films deposited on the inside surface of the chamber by plasma, after growing an insulating film on a substrate by plasma CVD and then taking out the substrate out of the chamber. This cleaning process is comprised of a first to third steps. In the first step, the gap between the first electrode and the second electrode is narrowed, a narrow space is formed, and cleaning is performed by the high density plasma created in a high power region of a VHF band high frequency. In the second step, the second electrode is lowered to the bottom surface of an insulator ring covering the inside wall of the chamber down from the main surface of the first electrode by a predetermined distance. In the third step, the second electrode is lowered to its lowest position and cleaning is performed by the low density plasma produced in a low power region of the VHF band high frequency.

In the above cleaning method, preferably the narrow space formed between the first electrode and the second electrode is at least a gap of 0.5 cm, preferably a gap of 1 to 2 cm.

In the above cleaning method, preferably, the density of the high density plasma at the first step and the second step is at least 1E11 cm$^{-3}$, typically about 5E11 cm$^{-3}$, while the density of the low density plasma at the third step is about 1E10 cm$^{-3}$.

In the above cleaning method, preferably, the high density plasma at the first step of the cleaning process is generated by superposing an LF band low frequency power from an LF band low frequency power source as a bias voltage on the upper electrode etc. with respect to the high frequency power from a VHF band high frequency power source. Further, at the time of the second step as well, it is possible to superpose the LF band low frequency power.

BEST MODE FOR WORKING THE INVENTION

Below, a preferred embodiment of the present invention will be described with reference to the attached drawings.

The configurations, shapes, sizes, and positional relationships explained in the embodiment are only shown schematically to the extent enabling understanding and working of the present invention. Further, the numerical values and compositions (materials) of the components are only illustrations. Therefore, the present invention is not limited to the following explained embodiment and can be modified in various ways so long as not exceeding the scope of the technical concept shown in the claims.

In the following description, the explanation will be given taking as an example a large plasma CVD system. However, the present invention is not limited to this. It may also be generally applied to plasma treatment systems.

Figure 1:
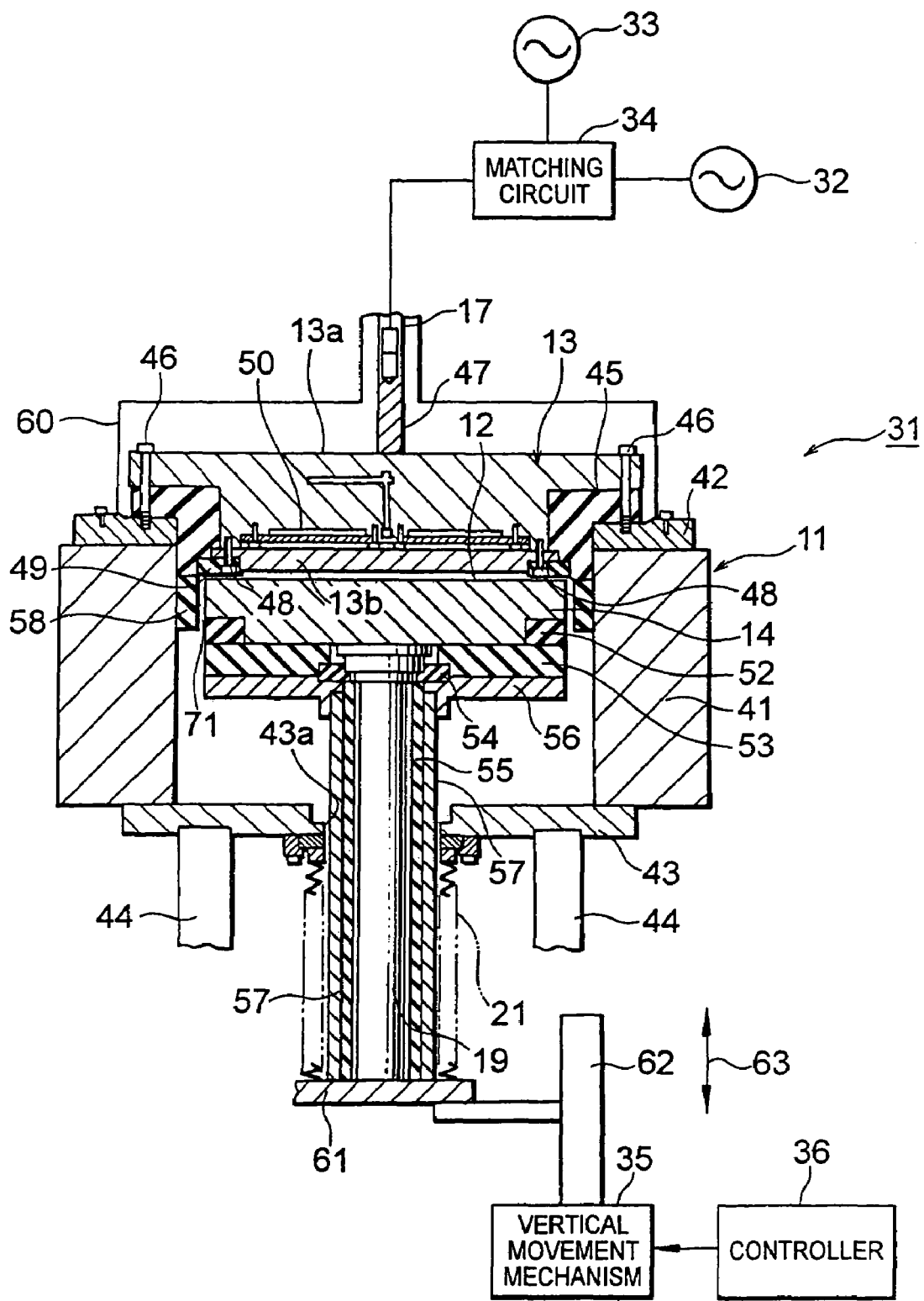
FIG. 1 is a vertical sectional view of the internal structure of a plasma treatment system according to an embodiment of the present invention.
Figure 2:
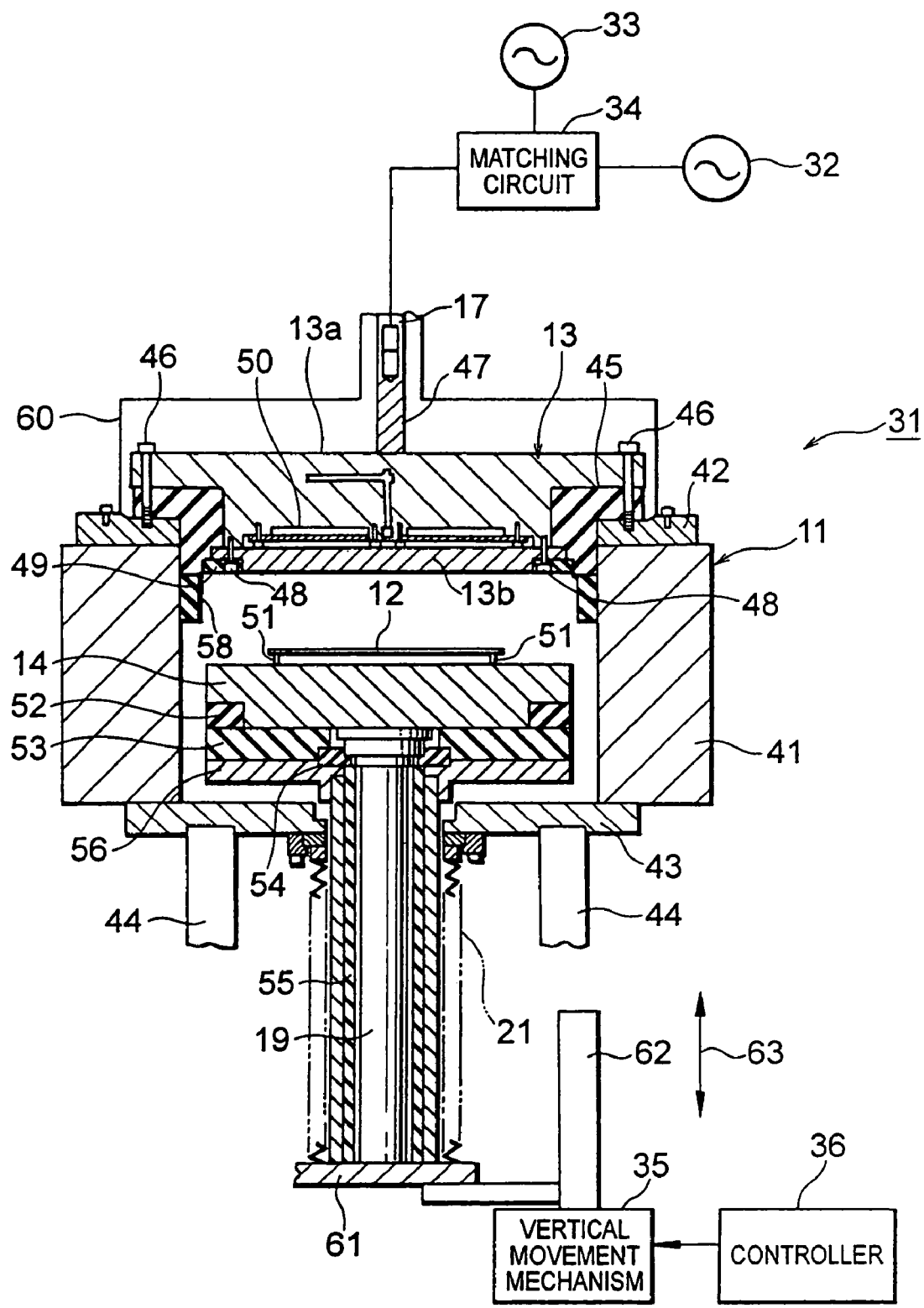
FIG. 2 is a vertical sectional view of another state of the internal structure of a plasma treatment system according to an embodiment of the present invention.

FIG. 1 and FIG. 2 are sectional views of the internal configuration of a plasma CVD system. This plasma CVD apparatus 31 has a parallel plate type electrode comprised of a top electrode 13 and a bottom electrode 14. The top electrode 13 is supplied with two types of frequencies superposed from a high frequency power source 32 of the VHF band high frequency and a low frequency power source 33 of a LF band low frequency. The bottom electrode 14 forms a substrate holder stage and is grounded. The bottom electrode 14 has a substrate stage. The bottom electrode 14 is provided with a vertical movement mechanism 35. This vertical movement mechanism (or elevator device) 35 raises and lowers the bottom electrode 14. FIG. 1 shows the state where the bottom electrode 14 is at its upper limit position, while FIG. 2 shows the state where the bottom electrode 14 is at its lower limit position.

In the above description, the two facing electrodes were referred to as the "top electrode" and "bottom electrode", but they may also be a first and a second electrode. The positions are not limited to top and bottom ones.

The reaction vessel 11 forming a film deposition (or forming) chamber is made by an air-tight structure and is set so that the inside becomes a required vacuum state (reduced pressure state). The reaction vessel 11 is made from a metal material and has conductivity. The reaction vessel 11 is provided in practice with a port for loading and unloading the substrates to be treated or processed, an evacuation (or exhaust) port and evacuating device etc. for evacuating the inside to a required vacuum state, and a gas introduction mechanism for introducing a discharge gas for causing discharge. In FIG. 1 and FIG. 2, known structures are used for the above components, so for convenience in explanation, their illustrations will be omitted.

The reaction vessel 11 is comprised of a cylindrical side member 41, a ceiling member 42, and a floor member 43. The reaction vessel 11 is grounded and is held at a ground potential. The floor member 43 is supported by a plurality of support columns 44 supporting the reaction vessel 11 as a whole. The center of the ceiling member 42 is formed with an opening. This opening has attached to it the top electrode 13 by bolts 46 through a ring-shaped insulator 45. The top electrode 13 is comprised of a top member 13a and a bottom member 13b. A connection terminal 47 provided at the center of the top surface of the top member 13a has a high frequency transmission cable 17 connected to it. The bottom surface of the top member 13a has the bottom member 13b fixed to it by screws 48. The screws 48 simultaneously attach the ring-shaped insulator 49 to the bottom edges of the bottom member 13b of the top electrode 13. The space between the top member 13a and the bottom member 13b and the inside of the top member 13a are formed with a gas channel 50 for carrying the process gas. Illustration of the gas introduction mechanism for introducing a discharge gas into this gas channel 50 is omitted.

The top electrode 13 and the bottom electrode 14 basically have the form of circular conductive plates overall and are arranged facing each other in parallel across a desired gap. The gap between the top electrode 13 and the bottom electrode 14 can be freely changed by changing the height position of the bottom electrode 14 by the vertical movement mechanism 35.

The top electrode 13 is connected to the high frequency power source 32 and the low frequency power source 33 through a matching circuit 34. The high frequency power source 32 is a power source for outputting power of a high frequency belonging to the VHF band for example, while the low frequency power source 33 is a power source for outputting power of a low frequency belonging to the LF band (or MF band) for example. The high frequency of the power output from the high frequency power source 32 is preferably 60 MHz, while the low frequency of the power output from the low frequency power source 33 is preferably 400 kHz. The frequencies output from the power sources 32 and 33 are superposed by the matching circuit 34 and supplied to the top electrode 13 in the superposed state. The high frequency and low frequency powers output from the power sources 32 and 33 are supplied to the top electrode 13 through the cable 17 and the connection terminal 47. The frequency supplied to the top electrode 13 becomes energy of main discharge caused in the gap between the top electrode 13 and the bottom electrode 14.

The high frequency power source 32 is a power source for causing plasma discharge and supplies the high power for producing high density plasma. The density is at least $1E11$ $cm^{-3}$, typically $5E11$ $cm^{-3}$ or more. Further, the lower frequency power source 33 is for giving a bias voltage for determining the collision energy of plasma ions. Note that the low frequency power supplied from the low frequency power source 33 can be given selectively.

The substrate 12 is loaded on the top surface of the bottom electrode 14. As shown in FIG. 2, when the bottom electrode 14 descends and reaches its lower limit position, the substrate 12 is supported by push rods 51 and is in a state floating from the stage of the bottom electrode 13. Further, as shown in FIG. 1, when the bottom electrode 14 is at its upper limit position, since the bottom electrode 14 rises and moves upward, the substrate 12 is carried in a state in contact with the top surface of the bottom electrode 13.

When the bottom electrode 14 rises and is at its upper limit position, the space created by the top electrode 13 and the bottom electrode 14 is relatively narrow, and thus a narrow space is formed. At this time, the gap (narrow space) between the bottom surface (main surface) of the top electrode 13 and the top surface of the bottom electrode 13 is preferably at least 0.5 cm, typically about 1 to 2 cm.

At the back surface side of the bottom electrode 14, a ring-shaped first insulator 52, a donut-shaped second insulator 53, a ring-shaped third insulator 54 and a cylindrical fourth insulator 55 are arranged. The back surface of the bottom electrode 14 and the surface of the support column 19 are all covered by the first to fourth insulators 52 to 55. Further, the surfaces of the second to fourth insulators 53 to 55 are covered by the two conductive members 56, 57. The insulators 52 to 55 are covered by the conductive members 56, 57 at all surfaces exposed inside the reaction vessel 11 except for the side surrounding surfaces of the first and second insulators 52, 53.

In the above configuration, an insulator ring 58 is provided so as to cover the inside wall of the reaction vessel 11 over a distance of typically at least 2 cm (or 3 cm) down from the bottom surface of the fixed top electrode 13. This insulator ring 58 is made by a material such as aluminum oxide strong against fluorine radicals (F radicals). Further, when the bottom electrode 14 is at the upper limit position, the distance between the surrounding side surfaces of the bottom electrode 14 and the inner surface of the insulator ring 58 is preferably not more than 5 mm. A constriction or constricted region 71 is formed between the surrounding side wall of the bottom electrode 13 and the inner surface of the insulator ring 58.

The support column 19 of the bottom electrode 14 has a rod shape. The support column 19 is made from a material having conductivity. The bottom end of the support column 19 is provided with a conductive flange 61. The support column 19 of the bottom electrode 14 and the parts related to it extend to a region below the reaction vessel 11 through an opening 43a formed in the floor member 43. These parts are surrounded by a bellows 21 attached to the bottom surface of the floor member 43 so as to cover the outside of the opening 43a formed in the floor member 43. The bellows 21 connects the edge of the opening 43a and the periphery of the flange 61 while maintaining an air-tight state.

As explained above, the reaction vessel 11 is grounded and maintained at the ground potential. The bottom electrode 14 is electrically connected to the reaction vessel 11 through the support column 19, the flange 61, and the bellows 21, so is similarly maintained at the ground potential.

In FIG. 1 and FIG. 2, the flange 61 is attached to the vertical movement mechanism 35. The flange 61 can be made to move up and down as shown by the arrows 63 along the guide 62 by the vertical movement mechanism 35. Along with the vertical movement of the flange 61, the bottom electrode 14 and the structural parts relating to the same also move up and down. The bellows 21 can structurally expand and contract, so expands and contracts in a state maintaining the above airtightness. Based on this structure, the bottom electrode 14 can be made to move up and down. Due to this, it is possible to change the height position of the substrate 12, change the gap (distance) between the top electrode 13 and the bottom electrode 14, and change the size of the gap. When causing main discharge between the top electrode 13 and the bottom electrode 14 to produce plasma and depositing a film based on the CVD action on the substrate 12 loaded on the bottom electrode 14, the bottom electrode 14 is made to move to its upper limit position to reduce the distance between the top electrode 13 and the bottom electrode 14. In the structure according to this embodiment, discharge is caused and plasma generated in a relative narrow gap space to form a film by CVD. When the film finishes being formed on the substrate 12, the vertical movement mechanism 35 makes the bottom electrode 14 move downward to widen the gap between the top electrode 13 and the bottom electrode 14. Due to this, it becomes possible to change to a substrate 12 to be treated next.

As explained above, due to the vertical movement mechanism 35, as shown in FIG. 1 and FIG. 2, the bottom electrode 14 and the structural parts relating to it are raised and lowered between the lower limit position and the upper limit position. The operation of the vertical movement mechanism 35 is controlled by the controller 36 comprised by a computer. The memory provided in the controller 36 stores various programs for executing the deposition process and the cleaning process.

Note that a conductive cover 60 is fixed to the top side of the reaction vessel 11. The cover 60 shields the insides from high frequencies. The cover 60 protects the top side of the top electrode 13 in the reaction vessel 11 from high frequencies.

In the structure shown in FIG. 1 and FIG. 2, the structural portion of the back surface of the bottom electrode 14 is covered by the insulators 52 to 56 at all of the outer surface of the connecting portion (support column 19) up to the ground potential portion (flange portion) including the back surface of the bottom electrode 14. As a result, it is possible to prevent the undesirable generation of discharge at the back surface side of the bottom electrode 14.

In the above plasma CVD system, usually when the bottom electrode 14 rises to the upper limit position, the position of the bottom electrode 14 is the position where the film deposition process is performed. When the bottom electrode 14 descends, the position of the bottom electrode 14 is the position for transport of the substrate. Further, at the time when the film deposition process ends, plasma is created for cleaning at a suitable timing (after unloading substrate etc.) This cleaning process is a step cleaning comprised of a plurality of steps. In this step cleaning, at the first step, the bottom electrode 14 is moved to the upper limit position and plasma discharge is caused in the narrow space to generate the high density plasma for cleaning. At the final step of the step cleaning, the bottom electrode 14 is made to descend to the lower limit position. At the final step of cleaning, the low density plasma is used.

In the reaction vessel 11 of a large-sized plasma CVD system shown in FIG. 1 and FIG. 2, the electrode gap between the top electrode 13 and the bottom electrode 14 at the time of the deposition process is 1 to 2 cm, more preferably 1 cm, that is, the narrow gap or narrow space system is employed. That is, the system is configured for so-called narrow space film deposition. By making the electrode gap narrow in this way, sealing the plasma between the electrodes becomes easy.

Further, the bottom electrode 14 on which the substrate 12 is loaded is grounded through a structure bypassing the high frequency power. This structure, as explained above, is based on a coaxial structure comprised of a first metal part (support column 19), insulator part (fourth insulator 55) and second metal part (conductive member 57). The support column 19 and the conductive member 57 are electrically connected by the terminal flange 61 and grounded. By this structure, the feedback high frequency will not leak from the bottom electrode 14. Therefore, discharge will not occur below the bottom electrode 14. This is confirmed from electromagnetic field simulations as well.

By adopting the structure explained above, it is possible to seal the plasma in the space between the electrodes, and plasma is not produced at the space below the bottom electrode stage. Therefore, it becomes possible to prevent film deposition at parts of the space below the bottom electrode stage.

Further, since the insulator ring 58 is provided as explained above, in the film deposition process, it is possible to reduce the film deposition on the exposed inner surface of the reaction vessel 11. The reasons will be explained in detail next.

Figure 3A:
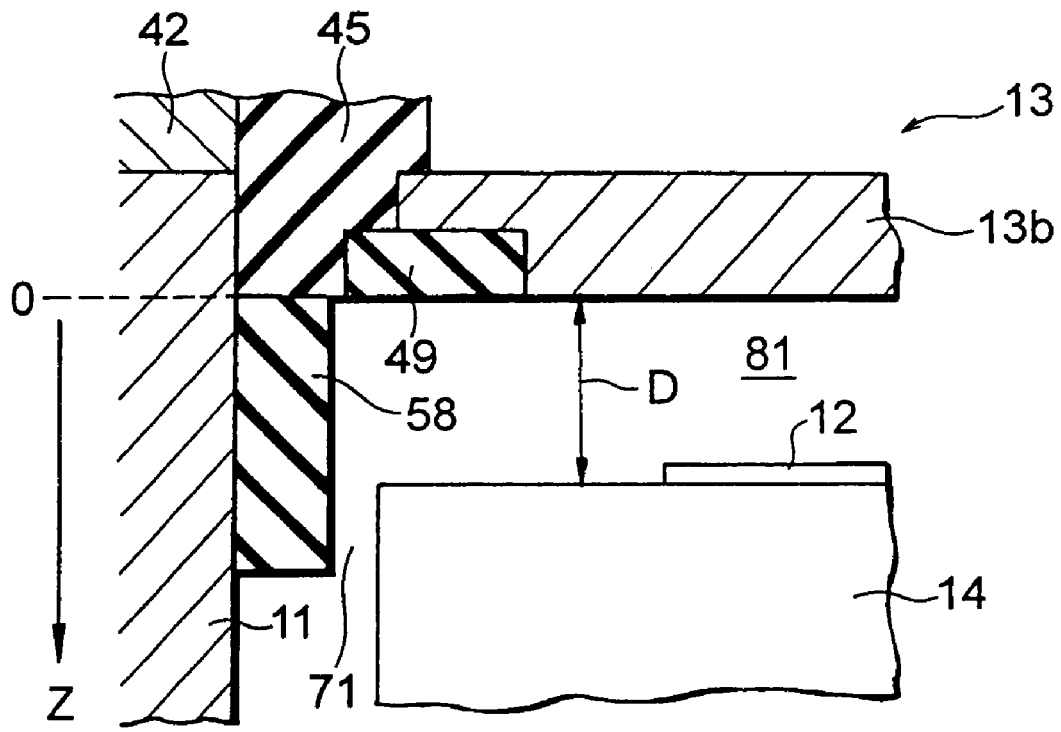
FIG. 3 is a view (A) partially showing the positional relationship between an insulator ring and a deposition space and is a view (B) of the degree of film deposition in a Z-direction of a reaction vessel at the time of film formation in a state where an insulator ring is provided.
Figure 3B:
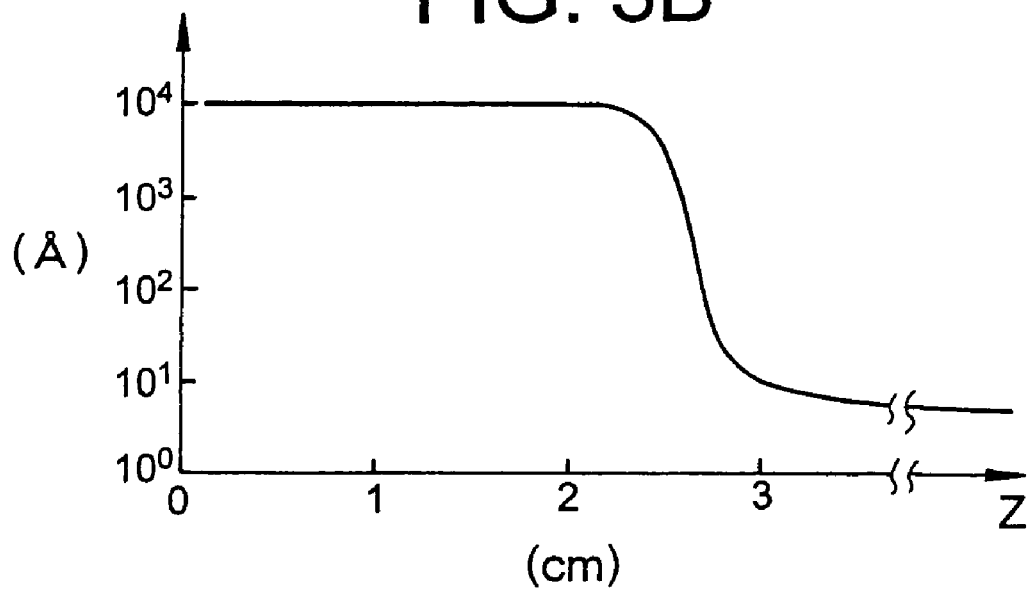

FIG. 3 is a view explaining the above reasons. In FIG. 3, (A) partially shows the positional relationship between the insulator ring 58 and the deposition space 81 formed as a narrow space, while (B) shows the extent of film deposition in the Z-direction of the reaction vessel 11 at the time of film formation in the state where the insulator ring 58 is provided. In (A) of FIG. 3, the Z-direction is shown, while in (B) of FIG. 3, the abscissa shows the distance (unit of cm) in the Z-direction and the ordinate shows the thickness (unit of angstroms (Å)) of the film deposited on the inner wall surface of the reaction vessel 11. As shown in (A) of FIG. 3, if performing the film deposition process when the distance D between the top electrode 13 and the bottom electrode 14 is 2 cm for example, and the film forming space is a narrow space, as clear from (B) of FIG. 3, at the inner wall surface of the reaction vessel 11, film deposits to a thickness of about $10^4$ Å until about 2 cm below the bottom surface of the top electrode 14, the amount of deposition of film is greatly reduced between 2 cm to 3 cm, and the thickness becomes about 10 Å about 3 cm from the bottom surface of the top electrode. Therefore, if considering the cleaning process of the inner surface of the reaction vessel 11 after this, it is preferable to use an insulator ring 58 to cover down to a location about 3 cm from the bottom of the top electrode 14.

Next, the cleaning process will be explained. In the cleaning of the inside of the reaction vessel 11, the step cleaning is performed. The step cleaning is a cleaning process expanding the plasma space step by step along with the elapse of time. It is a cleaning method comprised of a plurality of steps with different conditions. In the step cleaning, at the start of the cleaning, the bottom electrode 14 rises to the position for the film deposition process and the plasma space is made narrow. Therefore, in the cleaning in this state, it is possible to focus the high frequency power at the two electrodes of the top electrode 13 and the bottom electrode 14 where the film is deposited the thickest. Next, by lowering the bottom electrode 14 in stages or in steps, the wall surface is cleaned in a wider space formed by the top electrode 13, the bottom electrode 14, and part of the reaction vessel 11. At the final stage of the step cleaning, the bottom electrode 14 descends to the position carrying the substrate, whereby the heads of the lift pins sticking out from the surface of the stage of the bottom electrode 14 on which the substrate 12 is loaded are cleaned.

More specifically, the cleaning process is preferably comprised of a first to third steps.

In the first step, the gap between the top electrode 13 and the bottom electrode 14 is made a narrow space and cleaning is performed by the high density plasma generated by a high power region of the VHF band high frequency. At this time, a bias voltage is applied to the top electrode 13 by the lower frequency power source 33 simultaneously.

In the second step, the bottom electrode 14 is made to descend from the bottom surface (main surface) of the top electrode 13 to the bottom surface of the insulator ring 58 and in that state cleaning is performed using the high density plasma formed in the high power region of the VHF band high frequency. In this second step, preferably, a bias voltage is not supplied from the low frequency power source 33. Cleaning is only performed under conditions of the high density plasma. Note that it is also possible to apply the above bias voltage.

In the third step, the bottom electrode 14 is made to descend to the lowest position and cleaning is performed using the low density plasma formed in the low power region of the VHF band high frequency.

Note that when utilizing a VHF band high frequency power to generate plasma, it is possible to adjust the power in order to adjust the density of the plasma.

In the first step and the second step, the insulator ring 58 covers the inside surface of the reaction vessel 11, so it is possible to utilize high density plasma for cleaning. In the third step, the inner surface of the reaction vessel 11 appears and the reaction vessel 11 is made by an aluminum alloy, so low density plasma is used for cleaning.

The density of the high density plasma in the first step and second step in the above cleaning method is at least 1E11 cm$^{-3}$, preferably about 5E11 cm$^{-3}$, while the density of the lower density plasma in the third step is about 1E10 cm$^{-3}$.

Note that in the above step cleaning, the number of steps and at which timing to perform the steps can be freely determined in accordance with the objective and in accordance with the system.

In the present embodiment, the high density plasma is produced by the VHF band high frequency (typically 60 MHz) power supplied from the high frequency power source 32. It is known that by raising the excitation frequency of the plasma, it is possible to raise the plasma density, but in the present embodiment, the plasma density is raised to promote the higher order dissociation of the cleaning gas. As a result, it is possible to increase the amount of F radicals effective for etching the oxide film and possible to reduce the production of the high global warming coefficient byproduct $CF_4$ etc. (ancillary production).

The reaction vessel 11 of the large-sized plasma CVD system according to the present embodiment, is provided with a high frequency power source 32 for supplying a plasma excitation high frequency of 60 MHz and 3 kW for example, instead of the conventional 13.56 MHz. Further, a low frequency power source 33 for biasing processing at 400 kHz is built in for the purpose of improving the etching rate of the oxide film by ion collision. That is, in the present embodiment, to stably transmit a high frequency, a low frequency of 400 kHz is superposed on the high frequency to be applied to the top electrode 13.

Further, in the above plasma CVD system, since the film is deposited using the space between the top electrode 13 and the bottom electrode 14 as a narrow space, it is possible to secure uniformity of film deposition. To secure uniformity of film deposition in the narrow space, improvement of the precision of the parts is sought. In general, the points when making film deposition uniform on the surface of a substrate 12 are to generate uniform plasma and to create a distribution of density of gas with a good uniformity above the bottom electrode 14. From this viewpoint, the plasma CVD system of the present embodiment has the following characteristics.

A distribution of gas density with a good uniformity is formed on the stage of the bottom electrode 14. This plasma CVD system also supplies gas through a shower head provided at the top electrode 13. The first factor determining the uniformity of the distribution of the gas density above the bottom electrode 14 is the array of shower holes in the shower head. To enable the uniform supply of gas molecules even with an electrode gap of 1 cm, the distance between shower holes is preferably made 4 mm.

The second factor determining the uniformity of the distribution of the gas density is that the flow of gas is created symmetrically and uniformly above the bottom electrode 14. Therefore, a constriction or narrow path 71 is provided between the sides of the bottom electrode 14 and the insulator ring 58 provided at the inside wall of the reaction vessel 11, whose distance is 5 mm. The conductance of the flow of gas at the constriction 71 becomes smaller. Therefore, the flow of gas at the space between the top electrode 13 and the bottom electrode 14 becomes resistant to the effects of the distribution of conductance below the reaction vessel 11. As a result, despite the side gas evacuation using the evacuation port at the wall of the reaction vessel below the bottom electrode 14, it is possible to obtain a flow of gas with good symmetry in the space between the electrodes.

Figure 4:
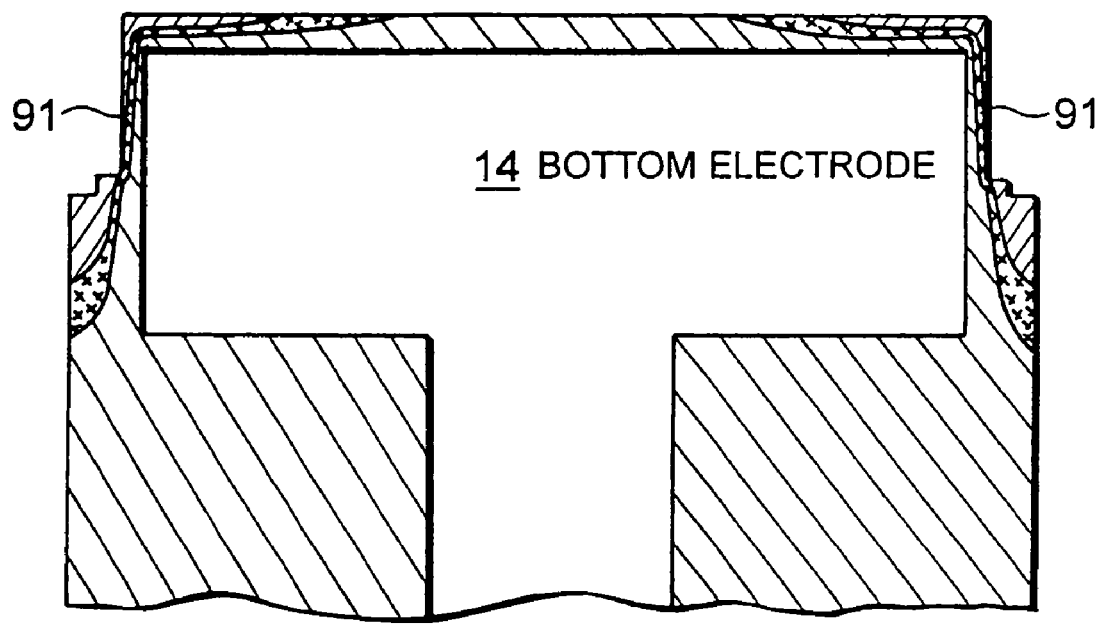
FIG. 4 is a status diagram showing a simulation of the flow of gas at the time of a deposition step.

The flow of the gas in the film deposition process will be explained next. The state of simulation of the flow of gas for only the case where the electrode gap at the time of the film deposition process is 1 cm is shown in FIG. 4 based on the above perspective. First, the results in the case of use of Ar gas as the gas are shown. The results of simulation when fixing the pressure at the evacuation port at 300 Pa and changing the flow rate of the gas introduced from the shower part of the top electrode 13 to 500 sccm are shown. As clear from the simulation, as explained above, by making the gap or distance of the constriction 71 preferably 5 mm, a flow of gas 91 with no swirls etc. is obtained. FIG. 4 is shown simplified, but in actuality a smooth flow of gas 91 comprised of a plurality of layers is created.

In the above description, both the top electrode 13 and the bottom electrode 14 were made from pure aluminum with an impurity concentration of not more than 1E-3, so corrosion by F radicals becomes small.

Further, at the above first step, the LF band high frequency power from the low frequency power source 33 is utilized to apply an electric field (bias) at the surfaces of the top electrode 13, the bottom electrode 14, and the insulator, but if the electric field is made stronger, it is possible to increase the cleaning rate by the effect of the ion kinetic energy.

Note that as specific examples, when depositing a silicon oxide film onto the substrate, $SiH_4$, $N_2O$, or diluted Ar is used as the process gas and conditions of a pressure of 300 Pa and a substrate temperature of 300° C. are set. Further, when depositing a silicon nitride film onto the substrate, $SiH_4$, $NH_3$, or $N_2$ is used as the process gas and conditions of a pressure of 300 Pa and a substrate temperature of 300° C. are set. Further, as the cleaning process, $C_2F_6$ (perfluorocarbon) or $O_2$ is set and the cleaning rate is increased by the above step cleaning.

According to the present invention, since the step cleaning is adopted in the cleaning process in a large-sized plasma CVD system, for example, it is possible to enhance the efficiency of utilization of the cleaning gas, possible to cut the amount of exhaust gas by this, possible to raise the cleaning rate, possible to improve the productivity, possible to cut the amount of process gas used, and possible to reduce the costs. In particular, since it is possible to improve the dissociation of $C_2F_6$ by the high density plasma cleaning in the first step and second step, it is possible to cut the amount of use and possible to reduce the production of the high global warming coefficient byproduct $CF_4$ etc., so it is possible to help solve the problem of global warming. Further, since the film deposition chamber is covered by an insulator ring down to a predetermined distance from the main surface of the top electrode, it is possible to reduce the amount of film deposition on the inner surface of the deposition chamber.

INDUSTRIAL APPLICABILITY

The plasma treatment system and cleaning method of the same according to the present invention raise the efficiency of utilization of the cleaning gas, cut the amount of exhaust gas, and raise the cleaning rate. Further, they cut the amount of process gas used, reduce the process cost, and are helpful in solving the problem of global warming.

The invention claimed is:

1. A cleaning method of a plasma treatment system, for growing an insulating film on a substrate by plasma CVD, then taking out the substrate, and then removing the film deposited inside a chamber by plasma, wherein the plasma treatment system is constructed to cover an inside wall of the chamber down to at least 3 cm from a main surface of a first electrode by an insulator ring, the cleaning method comprising sequential steps of:

forming a gap between the first electrode and a second electrode of at least 0.5 cm and a gap of not more than 5 mm between the insulator ring and the second electrode, and performing a first cleaning by generating a first density plasma, lowering the second electrode to a bottom surface of the insulator ring, and performing a second cleaning by generating the first density plasma, and lowering the second electrode to its lowest position lower than the bottom surface of the insulator ring, and performing a third cleaning by generating a second density plasma having a density lower than the first density plasma, the first density plasma and second density plasma being generated by power of a very high frequency.

2. A cleaning method of a plasma treatment system as set forth in claim 1, wherein the gap formed between the first electrode and the second electrode is 1 to 2 cm.

3. A cleaning method of a plasma treatment system as set forth in claim 1, wherein the density of the first density plasma is substantially $5 \times 10^{11}$ cm$^{-3}$ and the density of the second density plasma is substantially $1 \times 10^{10}$ cm$^{-3}$.

4. A cleaning method of a plasma treatment system as set forth in claim 1, wherein the first density plasma of the first cleaning is generated by superposing a power of a low frequency or medium frequency on the supplied very high frequency power.

5. A cleaning method of a plasma treatment system as set forth in claim 1, wherein the first density plasma of the first cleaning and second cleaning is generated by superposing a power of a low frequency or medium frequency on the supplied very high frequency power.

* * * * *